(12) United States Patent  (10) Patent No.: US 9,203,017 B2
Apalkov et al.  (45) Date of Patent: Dec. 1, 2015

(54) METHOD AND SYSTEM FOR PROVIDING MAGNETIC JUNCTIONS INCLUDING A PACKAGE STRUCTURE USABLE IN SPIN TRANSFER TORQUE MEMORIES

(71) Applicant: Samsung Electronics Co., LTD., Gyeonggi-do (KR)

(72) Inventors: Dmytro Apalkov, San Jose, CA (US); Vladimir Nikitin, Campbell, CA (US); Alexey Vasilyevitch Khvalkovskiy, Milpitas, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/325,049

(22) Filed: Jul. 7, 2014

(65) Prior Publication Data

US 2015/0035099 A1  Feb. 5, 2015

Related U.S. Application Data

(60) Provisional application No. 61/861,888, filed on Aug. 2, 2013.

(51) Int. Cl.
*H01L 43/12* (2006.01)
*H01L 43/08* (2006.01)
H01L 27/22 (2006.01)

(52) U.S. Cl.
CPC ............. *H01L 43/12* (2013.01); *H01L 43/08* (2013.01); *H01L 27/228* (2013.01)

(58) Field of Classification Search
CPC ....... H01L 43/10; H01L 43/02; H01L 27/222; G11C 11/15; G11C 11/16

USPC .......... 257/427, 421, 295, E43.001–E43.007, 257/E27.005–E27.006, E27.008, E29.164, 257/E29.167, E29.272, E29.323
See application file for complete search history.

(56) References Cited

U.S. PATENT DOCUMENTS

| | | | |
|---|---|---|---|
| 7,463,457 B2 | 12/2008 | Hasegawa | |
| 7,495,867 B2 | 2/2009 | Sbiaa | |
| 7,880,249 B2 | 2/2011 | Yuan | |
| 8,004,881 B2 | 8/2011 | Zhu | |
| 8,043,732 B2 | 10/2011 | Anderson | |
| 8,197,953 B2 | 6/2012 | Xi | |
| 8,288,023 B2 | 10/2012 | Gao | |
| 8,344,433 B2 | 1/2013 | Zhu | |
| 8,378,330 B2 | 2/2013 | Horng | |
| 2009/0091863 A1 | 4/2009 | Hosotani | |
| 2012/0153413 A1 | 6/2012 | Xi | |
| 2013/0069185 A1* | 3/2013 | Saida et al. | 257/422 |

* cited by examiner

*Primary Examiner* — Selim Ahmed
*Assistant Examiner* — Wasiul Haider
(74) *Attorney, Agent, or Firm* — Convergent Law Group LLP

(57) ABSTRACT

A method and system for providing a magnetic junction usable in a magnetic device are described. The magnetic includes a pinned layer, a nonmagnetic spacer layer, a free layer, and package structure(s). The pinned layer has a pinned layer perimeter and a top surface. The nonmagnetic spacer layer is on at least part of the top surface and between the pinned and free layers. The free layer has a free layer perimeter. The package structure(s) are ferromagnetic and encircles at least one of the free layer and the pinned layer. The package structure(s) are ferromagnetically coupled with the pinned layer. The magnetic junction is configured such that the free layer is switchable between stable magnetic states when a write current is passed through the magnetic junction.

20 Claims, 9 Drawing Sheets

METHOD AND SYSTEM FOR PROVIDING MAGNETIC JUNCTIONS INCLUDING A PACKAGE STRUCTURE USABLE IN SPIN TRANSFER TORQUE MEMORIES

CROSS-REFERENCE TO RELATED APPLICATIONS

This application claims the benefit of provisional Patent Application Ser. No. 61/861,888 filed Aug. 2, 2013, entitled PACKAGED WEDDING CAKE DESIGN FOR STT-MRAM IMPROVEMENT, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

FIG. 1 depicts a conventional dual magnetic tunneling junction (MTJ) 10 as it may be used in a conventional STT-MRAM. The conventional dual MTJ 10 typically resides on a bottom contact (not shown), uses conventional seed layer(s) (not shown) and may include conventional antiferromagnetic (AFM) layers (not shown) to fix, or pin, the magnetic moment of the pinned layers. The conventional magnetic junction includes a first conventional pinned layer 12 having magnetic moment 13, a conventional tunneling barrier layer 14, a conventional free layer 16 having changeable magnetic moment 17, a second conventional tunneling barrier layer 18 and a second conventional pinned layer 20 having a magnetic moment 21.

The conventional pinned layers 12 and 20 and the conventional free layer 16 are magnetic. The magnetization 17 of the conventional pinned layer 16 is fixed, or pinned, in a particular direction. For the perpendicular-to-plane pinning direction desired for the conventional pinned layer 12 and 20, the conventional pinned layers 12 and 20 each has a substantially stable magnetic moment 13 and 21, respective. Although depicted as a simple (single) layers, the conventional magnetic layers 12, 16 and 20 may include multiple layers. For example, the conventional magnetic layers 12, 16 and/or 20 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic.

To switch the magnetization 17 of the conventional free layer 16, a current is driven perpendicular to plane (in the z-direction). When a sufficient current is driven through the free layer 16, the free layer may be switched to be parallel to the magnetic moment 13 or antiparallel to the magnetic moment 13. The differences in magnetic configurations correspond to different magnetoresistances and thus different logical states (e.g. a logical "0" and a logical "1") of the conventional MTJ 10.

To enhance the spin-transfer based switching, the conventional pinned layers 12 and 20 are desired to be in a "dual state", as shown. Stated differently, the magnetic layers of the conventional pinned layers 12 and 20 that are closest to the conventional free layer 16 are desired to have their magnetic moments in opposite direction. Typically, this dual state is achieved by ensuring that the coercivities of the pinned layers 12 and 20 are significantly different. Thus, a high magnetic field may be applied along the easy axis to align the magnetic moments 13 and 21. A lower magnetic field may then be applied in the opposite direction to switch the magnetic moment of one of the pinned layers 12 or 20, while leaving the magnetic moment of the other pinned layer 20 or 12 unchanged.

Although the conventional dual MTJ 10 may be written using spin transfer and used in an STT-MRAM, there are drawbacks. For example, the write error rates (WER) may be higher than desired for memories having an acceptable $I_{c0}$ and pulse width. The write error rate (WER) is the probability that a cell (i.e. the magnetic moment 17 of free layer 16 of the conventional dual MTJ 10) is not switched when subjected to a current that is at least equal to the typical switching current. For example, the conventional dual MTJ 10 may be subject to back hopping. The write current driven through the conventional MTJ 10 may also destabilize the magnetic moment(s) of the pinned layers 12 and/or 20. The magnetic moment 17 of the conventional free layer 16 that has been switched using spin transfer torque may switch back (or hop back) to its initial state. This back hopping and the attendant increase in error rate is undesirable. Further, the dual state for the magnetic moments 13 and 21 of the pinned layers 12 and 20 depicted in FIG. 1 may be difficult to achieve in a magnetic memory including an array of conventional dual MTJs 10. In particular, variations between individual conventional dual MTJs 10 in the array may preclude setting most or all of the array using two fields as discussed above. This may render some magnetic junctions unusable.

Accordingly, what is needed is a method and system that may improve the performance of the spin transfer torque based memories. The method and system described herein address such a need.

BRIEF SUMMARY OF THE INVENTION

A method and system for providing a magnetic junction usable in a magnetic device are described. The magnetic includes a pinned layer, a nonmagnetic spacer layer, a free layer and package structure(s). The pinned layer has a pinned layer perimeter and a top surface. The nonmagnetic spacer layer is on at least part of the top surface and between the pinned and free layers. The free layer has a free layer perimeter. The package structure(s) are ferromagnetic and encircles at least one of the free layer and the pinned layer. The package structure(s) are ferromagnetically coupled with the pinned layer. The magnetic junction is configured such that the free layer is switchable between stable magnetic states when a write current is passed through the magnetic junction.

DETAILED DESCRIPTION OF THE INVENTION

Figure 1:
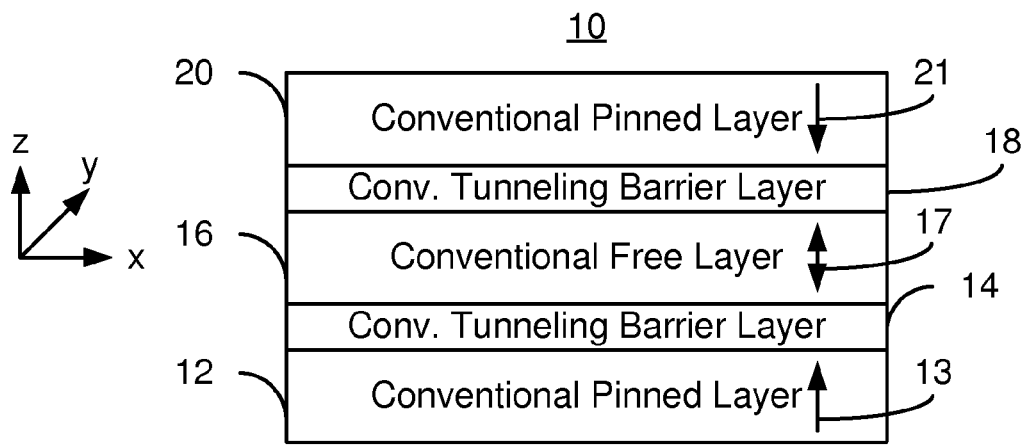
FIG. 1 depicts a conventional dual magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems for providing a magnetic junction as well as a magnetic memory utilizing the magnetic junction are described. The exemplary embodiments provide methods and systems for providing a magnetic junction usable in a magnetic device. The magnetic includes a pinned layer, a nonmagnetic spacer layer, a free layer and package structure(s). The pinned layer has a pinned layer perimeter and a top surface. The nonmagnetic spacer layer is on at least part of the top surface and between the pinned and free layers. The free layer has a free layer perimeter. The package structure(s) are ferromagnetic and encircles at least one of the free layer and the pinned layer. In some embodiments, an interlayer is between the pinned layer and the package structure. In some embodiments, the package structure(s) reside on a portion of the top surface of the pinned layer and encircle at least the free layer. The nonmagnetic interlayer also resides on the top surface of the pinned layer in such an embodiment. In other embodiments, the package structures encircle only the pinned layer. The nonmagnetic interlayer is between the pinned layer perimeter and the package structure(s) in such embodiments. In still other embodiments, the package structure(s) encircle the pinned layer and the free layer. The nonmagnetic interlayer is between the pinned layer perimeter and the package structure(s) and between the free layer perimeter and the package structure(s) in such embodiments. The package structure(s) are ferromagnetically coupled with the pinned layer. The magnetic junction is configured such that the free layer is switchable between stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2A:
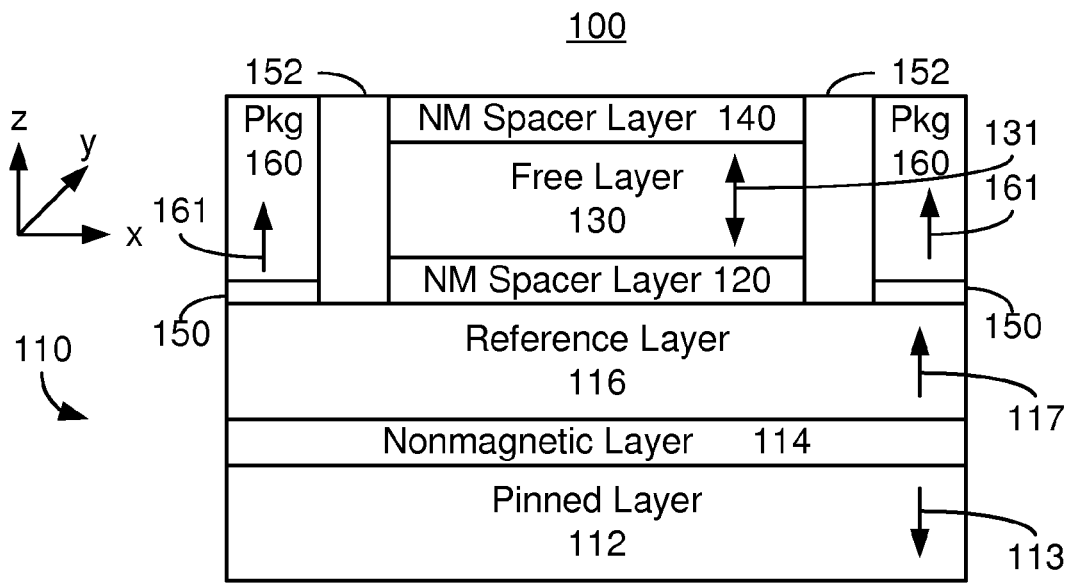
FIGS. 2A and 2B depict side and perspective views of an exemplary embodiment of a magnetic junction usable in a magnetic device.
Figure 2B:
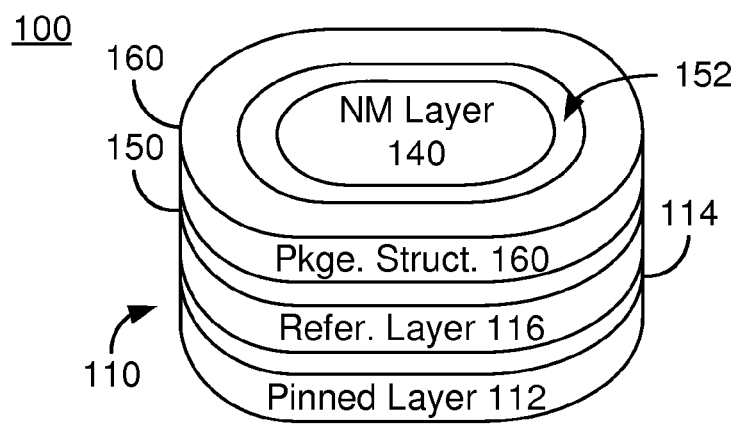

FIGS. 2A-2B depict side and perspective views of an exemplary embodiment of a magnetic junction 100 usable in a magnetic device. The magnetic device in which the magnetic junction 100 is used may be used in a variety of applications. For example, the magnetic device, and thus the magnetic substructure, may be used in a magnetic memory such as an STT-MRAM. For clarity, FIGS. 2A-2B are not to scale and not all components of the magnetic junction are shown. For example, any seed and/or capping layers as well as the substrate are omitted.

The magnetic junction 100 includes a pinned layer 110, a nonmagnetic spacer layer 120, a free layer 130, an optional additional nonmagnetic spacer layer 140, an optional interlayer 150, optional filler 152, and an optional package structure 160. Although layers 110, 120, 130, 140, 150, 152 and 160 are shown with a particular orientation, this orientation may vary in other embodiments. For example, the pinned layer 110 may be closer to the top (furthest from a substrate that is not shown) of the magnetic junction 100. In some embodiments, an optional pinning layer (not shown) adjoins the pinned layer 110 on the opposite side of the nonmagnetic spacer layer 120. Such a pinning layer may be an AFM layer or multilayer that pins the magnetization (not shown) of the pinned layer 110 by an exchange-bias interaction. However, in other embodiments, another structure may be used or pinning layer may be omitted because the magnetic moment(s) of the pinned layer are stable. The magnetic junction 100 is also configured to allow the free layer 130 to be switched between stable magnetic states when a write current is passed through the magnetic junction 100. Thus, the free layer 130 is switchable utilizing spin transfer torque.

In the embodiment shown, the free layer 130 extends over only a portion of the top surface of the pinned layer 110. Although shaped similarly (e.g. both are ellipses), the lateral/in-plane dimensions of the free layer 130 are less than those of the pinned layer 110. Stated differently, the perimeter of the free layer 130 is less than the perimeter of the pinned layer 110. In the embodiment shown, the free layer 130 is also substantially centered on the pinned layer 110. In other embodiments, the free layer 130 may not be centered and/or may extend to one or more edges of the pinned layer. The magnetic junction 100 may be termed to have a "wedding cake" structure because the free layer 130 and pinned layer 110 resemble tiers of a wedding cake.

Although depicted as a simple layer, the free layer 130 may include multiple layers. For example, the free layer 130 may be a SAF including magnetic layers antiferromagnetically or ferromagnetically coupled through thin layers, such as Ru. In such a SAF, multiple magnetic layers interleaved with thin layer(s) of Ru or other material may be used. The free layer 130 may also be another multilayer. For example, the free layer 130 may include a layer having an enhanced spin polarization (a polarization enhancement layer) adjoining the nonmagnetic spacer layer 120 to improve performance of the magnetic junction 100. In the embodiment shown in FIGS. 2A-2B, the free layer 130 may have a perpendicular anisotropy energy that exceeds the out-of-plane demagnetization energy. Thus, the free layer 130 may have its magnetic moment 131 oriented perpendicular to plane. In other embodiments, the magnetic moment of the free layer 130 might be in-plane. Other orientations of the magnetic moment of the free layer 130 are possible.

The spacer layer 120 is nonmagnetic. In some embodiments, the spacer layer 120 is an insulator, for example a tunneling barrier. In such embodiments, the spacer layer 120 may include crystalline MgO having a (100) orientation, which may enhance the TMR of the magnetic junction. In other embodiments, the spacer layer may be a conductor. In alternate embodiments, the spacer layer 120 might have another structure, for example a granular layer including conductive channels in an insulating matrix. In embodiments in which the spacer layer 120 is crystalline MgO, the magnetoresistance of the magnetic junction 100 and the perpendicular anisotropy of the free layer 130 may be enhanced.

The magnetic junction 100 may also include an additional nonmagnetic spacer layer 140. The nonmagnetic spacer layer 140 may be used to enhance the perpendicular magnetic anisotropy of the free layer 130. For example, the nonmagnetic spacer layer 140 may include crystalline MgO having a (100) orientation. In other embodiments, the nonmagnetic spacer layer 140 may be omitted.

The pinned layer 110 shown is a SAF including ferromagnetic layers 112 and 116 separated by nonmagnetic layer 114. The ferromagnetic layer 112 is termed a pinned layer, while the layer 116 is termed a reference layer 116. The nonmagnetic spacer layer 114 may be a material, such as Ru, through which the layers 112 and 116 are coupled. In the embodiment shown, the ferromagnetic layers 112 and 116 are antiferromagnetically coupled, for example via an RKKY interaction. In the embodiment shown in FIGS. 2A-2B, the reference layer 116 and pinned layer 112 each has a perpendicular anisotropy energy that exceeds the out-of-plane demagnetization energy. Thus, the reference layer 116 and pinned layer 112 each has its magnetic moment 117 and 113, respectively, oriented perpendicular to plane. In other embodiments, the magnetic moments of the layers 112 and 116 might be in-plane. Other orientations of the magnetic moments of the pinned layer 110 are possible. However, for a SAF pinned layer 110, the magnetic moments 113 and 117 are coupled antiparallel.

The top surface of the pinned layer 110, and thus the top surface of the reference layer 116 is only partially occupied by the layers 120, 130 and 140. In some embodiments, the lateral dimensions (substantially in the x-y plane) of the pinned layer 110 are at least 1.2 multiplied by those of the free layer 130. In some such embodiments, the lateral dimensions of the pinned layer 116 are at least 1.5 multiplied by those of the free layer 130. However, the lateral dimensions of the pinned layer 110 may generally be desired to be not more than three multiplied by those of the free layer 110. In other embodiments, other size ratios are possible.

In the embodiment shown, package structure 160 resides on a portion of the pinned layer 110 not occupied by the remaining stack (e.g. the nonmagnetic spacer layer 120, free layer 130 and nonmagnetic spacer layer 140). An interlayer 150 may reside between the package structure 160 and the pinned layer 110. The filler 152 may separate the package structure 160 from the free layer 130 and nonmagnetic spacer layers 120 and 140. In some embodiment, the filler 152 and interlayer may be made of the same material. Because the filler separates a portion of the layers from the package structure 160, the filler 152 may be considered part of the interlayer 150 regardless of whether they include the same or different materials. The package structure 160 is desired to be electrically isolated from the layers 110, 120, 130 and 140 and magnetically decoupled from the free layer 130. The filler 152 may be insulating or conductive. The interlayer 150 is desired to be insulating so that the package structure 160 is electrically insulated from the reference layer 110. In such embodiments, the filler 152 may be insulating or conductive. If insulating, the filler 152 may be made of the same (or different) materials as the interlayer 150. If the filler 152 is conductive, then the filler 152 may include Ru, Rh, Ir or other material. In some embodiments, the interlayer 150 is nonmagnetic, while in other embodiments, the interlayer 150 is magnetic. In embodiments in which the interlayer 150 is nonmagnetic, the interlayer 150 may also be considered extend between the package structure 160 and the free layer 130 (i.e. may include the filler 152). However, in other embodiments a different nonmagnetic material could be used for this region.

The package structure 160 is ferromagnetic and encircles the free layer 130. For example, materials that may be used for the package structure 160 include but are not limited to CoxFeyBz (with x+y+z=1), Co/Pt (multilayer or alloy), Fe/Pt (multilayer or alloy), Fe/Pd (multilayer or alloy), Co/Pd (multilayer or alloy), Co/Ni (multilayer or alloy) and/or Rare-earth-based alloys or multilayers including but not limited to CoFeTb, CoFeGd, FeTb, FeGd, CoTb, and/or CoGd. Thus, as can be seen in FIG. 2B, the package structure 160 surrounds the sides of the free layer 130. In the embodiment shown, the package structure 160 is separated from the free layer 130 by the filler 152. However, in other embodiments, other configurations are possible. For example, the filler 152 may be omitted, replaced with another material, and/or be considered part of the interlayer 150. The package structure 160 may be magnetically decoupled from the free layer 130 but ferromagnetically coupled with the pinned layer 110. More specifically, the package structure is ferromagnetically coupled with the reference layer 116. In some embodiments, the package structure 160 is exchange coupled to the reference layer 116. In other embodiments, the package structure is magnetostatically coupled with the reference layer 116. Other magnetic couplings may be possible. In embodiments in which the interlayer 150 is nonmagnetic, the interlayer 150 is sufficiently thin to allow this coupling between the package structure 150 and the pinned layer 110. In the embodiment shown, the package structure 160 extends to the top of the nonmagnetic spacer layer 140. In other embodiments, the package structure 160 may have other heights. However, the package structure 160 is generally desired to extend at least to the top of the free layer 130. The outer perimeter of the package structure 160 is substantially aligned with and the same as the perimeter of the pinned layer 110. However, the inner perimeter of the package structure 160 is greater than the perimeter of the free layer 130. Thus, the package structure is spaced apart and magnetically decoupled from the free layer 130.

The magnetic junction 100 may have improved performance. As discussed above, the pinned layer 110 has larger lateral dimensions than the free layer 130. The magnetic moments 113 and 117 may be more stable. Consequently, the magnetic moments 113 and 117 are less likely to be disturbed during programming of the free layer 130 using a perpendicular-to-plane current. This stability is further promoted by the presence of the package structure 160 magnetically coupled to the pinned layer 110. Back hopping may thus be mitigated or prevented. Further, the larger lateral sizes of the reference layer 116 and pinned layer 112 may translate to reduced cell-to-cell variations when the magnetic junction 100 is used in a memory array. In addition, use of a SAF for the pinned layer 110 results in a reduced net magnetostatic field on the free layer 130 due to other magnetic layers in the magnetic junction 100. This is because the magnetic field at the free layer due to the reference layer 116 may at least be partially canceled by the field due to the pinned layer 112. Thus, performance of the magnetic junction may be improved.

Figure 3A:
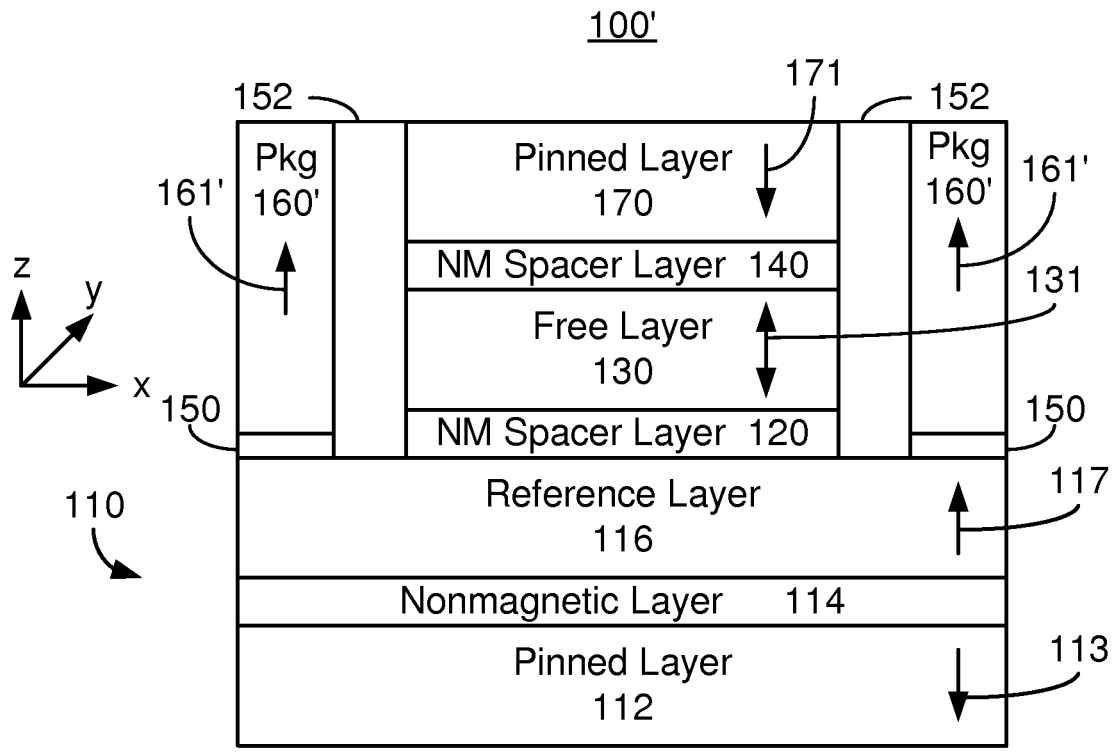
FIGS. 3A and 3B depict side and perspective views of another exemplary embodiment of a magnetic junction usable in a magnetic device.
Figure 3B:
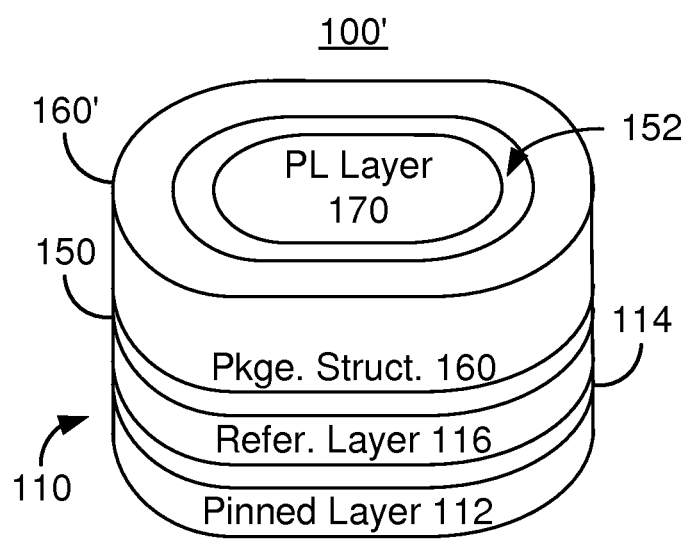

FIGS. 3A and 3B depict side and perspective views of another exemplary embodiment of a magnetic junction 100'. For clarity, FIGS. 3A-3B are not to scale and not all components of the magnetic junction are shown. For example, any seed and/or capping layers as well as the substrate are omitted. The magnetic junction 100' is analogous to the magnetic junction 100. Thus, analogous layers are labeled similarly. The magnetic junction 100' includes a pinned layer 110, a nonmagnetic spacer layer 120, a free layer 130, an optional additional nonmagnetic spacer layer 140, an optional interlayer 150/filler 152 and an optional package structure 160' that are analogous to the pinned layer 110, nonmagnetic spacer layer 120, free layer 130, optional additional nonmagnetic spacer layer 140, optional interlayer 150/filler 152 and optional package structure 160, respectively. The magnetic junction 100' also includes an additional pinned layer 170 having a magnetic moment 171. Thus, the magnetic junction 100' is a dual magnetic junction. As discussed above with respect to the magnetic junction 100, other and/or additional layers might also be used. The magnetic junction 100' is also configured to allow the free layer 130' to be switched between stable magnetic states when a write current is passed through the magnetic junction 100'. Thus, the free layer 130 is switchable utilizing spin transfer torque.

The magnetic junction 100' includes a wedding cake structure. Thus, the free layer 130 extends over only a portion of the top surface of the pinned layer 110. In the embodiment shown, the free layer 130 is also substantially centered on the pinned layer 110. In other embodiments, the free layer 130 may not be centered on the pinned layer 110 and/or may extend to one or more edges of the pinned layer. Although depicted as a simple layer, the free layer 130 may include multiple layers, as discussed above. In the embodiment shown in FIGS. 3A-3B, the free layer 130 may have a perpendicular anisotropy energy that exceeds the out-of-plane demagnetization energy. Thus, the free layer 130 may have its magnetic moment 131 oriented perpendicular to plane. In other embodiments, other orientations of the magnetic moment of the free layer 130 are possible.

The spacer layers 120 and 140 are nonmagnetic. In some embodiments, the spacer layers 120 and/or 140 are insulators, for example a tunneling barrier. In such embodiments, the spacer layer(s) 120 and/or 140 may include crystalline MgO having a (100) orientation, which may enhance the TMR of the magnetic junction. Use of such material(s) may also enhance the perpendicular magnetic anisotropy of the free layer 130. In other embodiments, the spacer layer(s) 120 and/or 140 may be other material(s) including but not limited to conductor(s).

The pinned layer 110 shown is a SAF including ferromagnetic layers 112 and 116 separated by nonmagnetic layer 114. However, in other embodiments, the pinned layer 110 may be a simple layer. For example, the reference layer 116 may be used as the pinned layer 110 and the layers 112 and 114 omitted. In the embodiment shown in FIGS. 3A-3B, the reference layer 116 and pinned layer 112 each has a perpendicular anisotropy energy that exceeds the out-of-plane demagnetization energy. Thus, the reference layer 116 and pinned layer 112 each has its magnetic moment 117 and 113, respectively, oriented perpendicular to plane. In other embodiments, the magnetic moments of the layers 112 and 116 might have other orientations. As discussed above, the lateral dimensions of the pinned layer 110 are larger than those of the free layer 130.

The pinned layer 170 also has a perpendicular anisotropy energy that exceeds the out-of-plane demagnetization energy. Thus, the magnetic moment 171 is perpendicular to plane. In other embodiments, the pinned layer 170 may have its magnetic moment 171 oriented in another direction. In the embodiment shown, the lateral dimensions of the pinned layer 170 are substantially the same as that of the free layer 130. Thus, the pinned layer 170 has a perimeter that is not larger than that of the free layer. However, in other embodiments, other configurations are possible. For example, at least part of the pinned layer 170 may extend over the package structure 160. In some such embodiments, the package structure 160' does not extend to the bottom of the pinned layer 170. In other such embodiments, the pinned layer 170 may be configured such that a portion of the pinned layer 170 is encircled by the package structure 160', while another portion of the pinned layer 170 extends over the package structure 160'. In still other embodiments, the pinned layer 170 may have its lateral dimensions larger than those of the free layer 130, but smaller than the inner lateral dimensions of the package structure 160'. In either case, the pinned layer 170 is spaced apart from the package structure 160'. The pinned layer 170 is also depicted as a simple layer. In other embodiments, however, the pinned layer 170 may be a multilayer. For example, the pinned layer 170 may be a SAF.

The interlayer 150 may reside between the package structure 160' and the pinned layer 110. The filler 152 may be between the package structure 160' and the structures 120, 130, 140 and 170. Some or all of the filler 152 may be considered to be part of the interlayer 152. Portion(s) of the interlayer 150 and filler 152 may be insulating or conductive, and nonmagnetic or magnetic. However, the package structure 160' is desired to be electrically isolated from the layers 110, 120, 130, 140 and 170 and magnetically decoupled from the free layer 130. In some embodiments, the interlayer 150 and filler 152, are desired to be a nonmagnetic insulator. In embodiments in which the interlayer 150 is nonmagnetic, the interlayer 150 may also be considered to include the filler 152 between the free layer 130 and the package structure 160'. However, in other embodiments, another nonmagnetic material may be used.

The package structure 160' resides on a portion of the pinned layer 110 not occupied by the remaining stack. The package structure 160' is ferromagnetic and encircles at least the free layer 130. The package structure 160' may be magnetically decoupled from the free layer 130, but ferromagnetically coupled with the pinned layer 110. More specifically, the package structure 160' is ferromagnetically coupled with the reference layer 116. In some embodiments, the package structure 160' is exchange coupled to the reference layer 116. In other embodiments, the package structure 160' is magnetostatically coupled with the reference layer 116. In other embodiments, other couplings may be possible. In the embodiment shown, the package structure 160' extends to the top of the pinned layer 170. As discussed above, the package structure 160' may have other heights. However, the package structure 160' is generally desired to extend at least to the top of the free layer 130'. The outer perimeter of the package structure 160' is substantially aligned with and the same as the perimeter of the pinned layer 110'. However, the inner perimeter of the package structure 160' is greater than the perimeter of the free layer 130 and, in the embodiment shown, the perimeter of the pinned layer 170. Thus, the package structure 160' is spaced apart and magnetically decoupled from the free layer 130 and the pinned layer 170.

The magnetic junction 100' may have improved performance. Because of the difference in lateral dimensions of the pinned layer 110 and the free layer 130, the magnetic moments 113 and 117 may be more stable. This stability is further promoted by the presence of the package structure 160' magnetically coupled to the pinned layer 110. Consequently, the pinned layer 110 may be less likely to be disturbed during programming of the free layer. Back hopping may thus be mitigated or prevented. Further, the larger lateral sizes of the pinned layer 110 may result in reduced cell-to-cell variations when the magnetic junction 100' is used in a memory array. In addition, use of a SAF for the pinned layer 110 results in a reduced net magnetostatic field on the free layer 130. Thus, performance of the magnetic junction 100' may be improved. In addition, the differences in the pinned layer 110 and 170 may more naturally result in different tunneling magnetoresistances across the spacer layers 120 and 140. The magnetoresistance of the magnetic junction 100' for the free layer magnetic moment 131 oriented parallel to the reference layer magnetic moment 117 may be different from the magnetoresistance of the magnetic junction 100' for the free layer magnetic moment 131 being antiparallel to the magnetic moment 117 of the reference layer 116. Thus, the magnetic junction 100' may be more easily read even when the pinned layers 110 and 170 are in the dual state as shown.

Further, the pinned layer 110 (e.g. reference layer 116) and the pinned layer 170 may be more easily set to the dual state shown in FIG. 3A. This is because the package structure 160' aids in flux closure for the dual state. Because of flux closure, the lower energy state for the magnetic junction 100' is the dual state. Consequently, the magnetic junction 100' may be more likely to settle into the dual state without a setting procedure. In addition, the setting procedure may be simplified, using the application of a single field substantially perpendicular to the direction of the magnetic moments 113, 117 and 171. Thus, multiple fields may not be required to set the magnetic junction 100' into the dual state for writing.

Figure 4A:
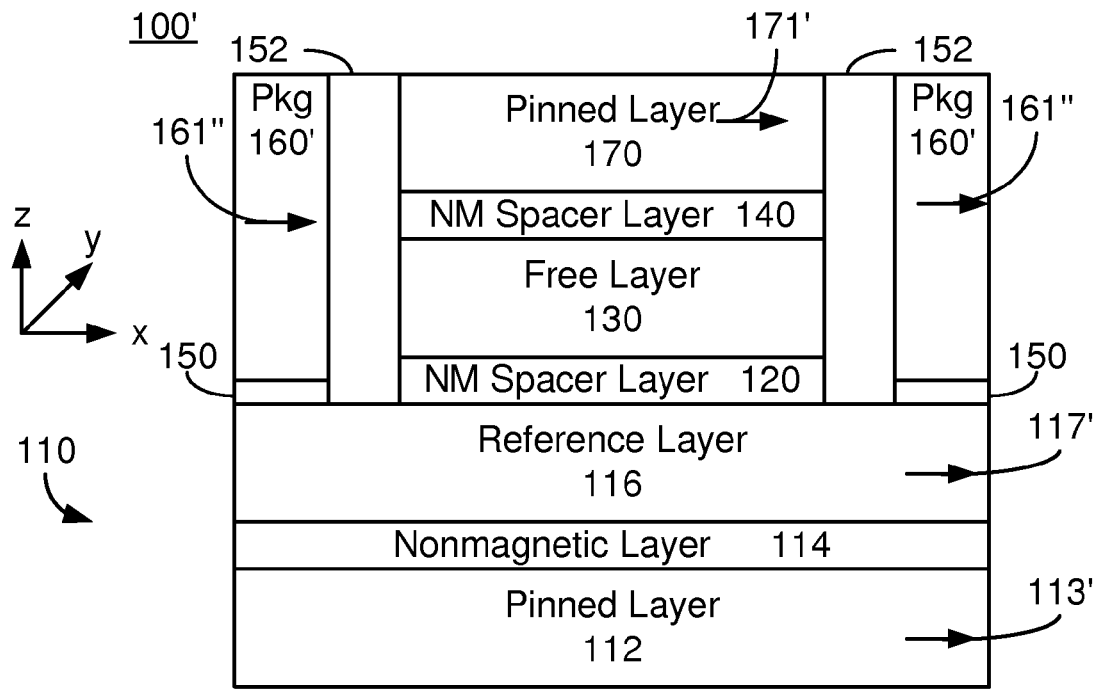
FIGS. 4A-4C depicts side views of another exemplary embodiment of a magnetic junction usable in a magnetic device during one setting procedure.
Figure 4B:
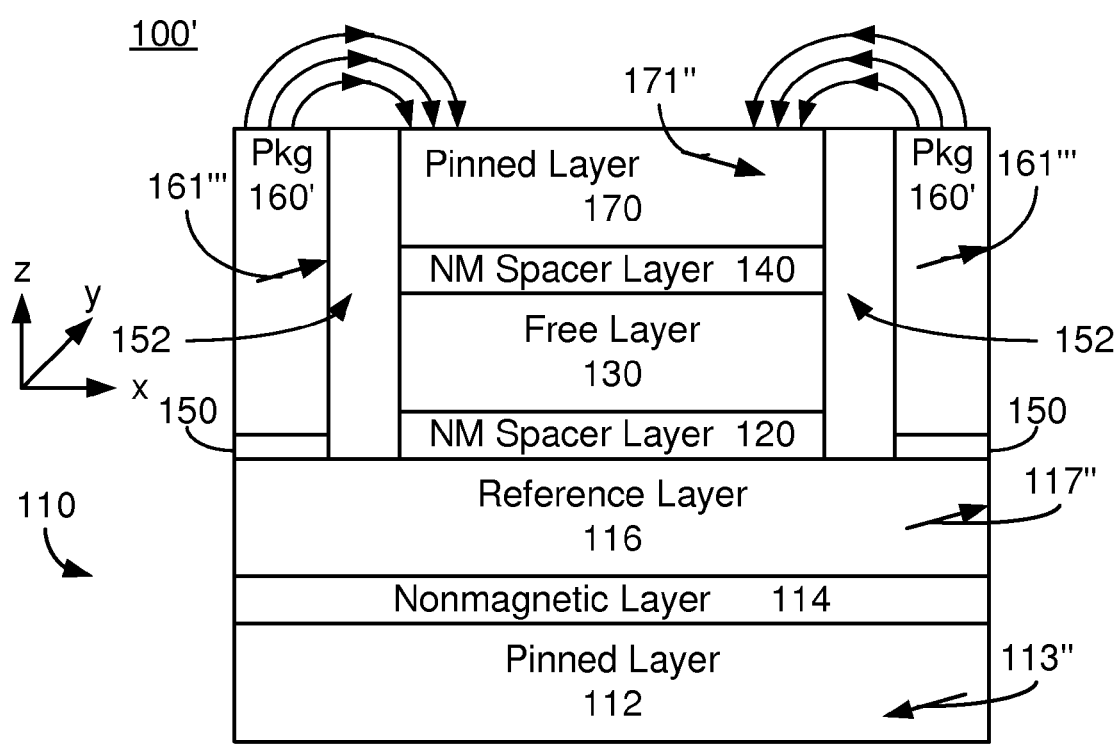
Figure 4C:
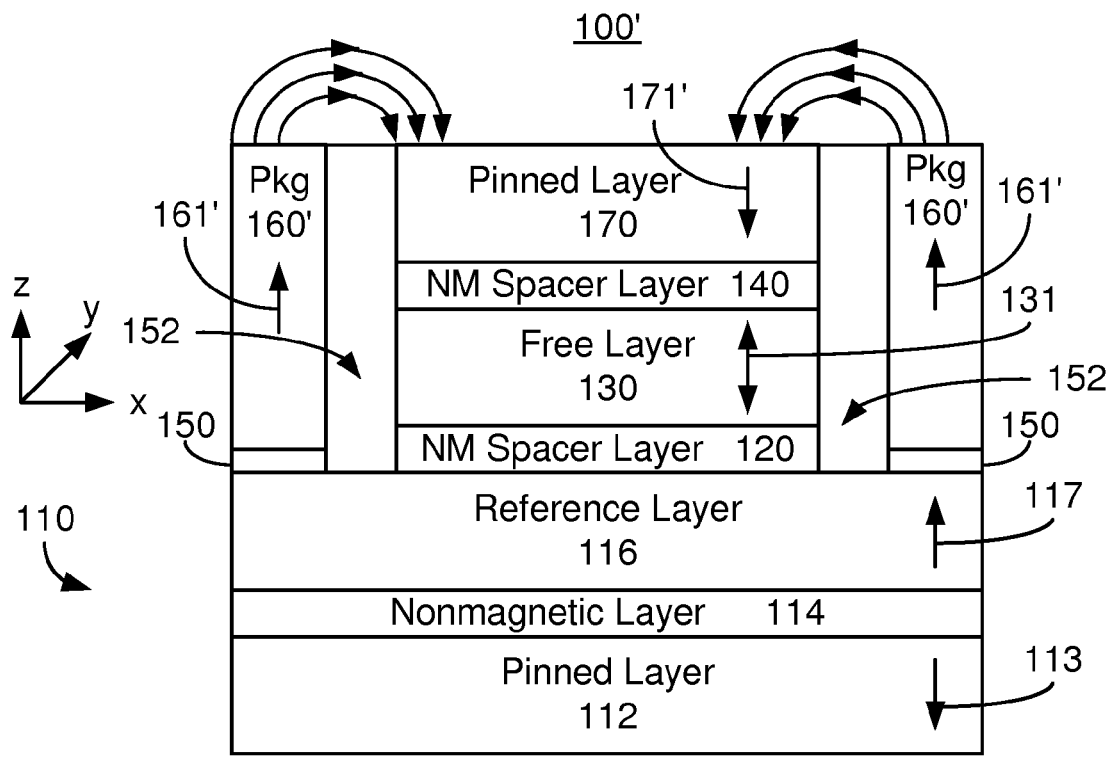

To further explicate this benefit, FIGS. 4A-4C depict an exemplary embodiment of the magnetic junction 100' during such a setting procedure. A single field, Hext, is applied to the magnetic junction 100'. This field may be applied at room temperature or during an anneal. This field can be seen in FIG. 4A. As a result, of the application of the field, the magnetic moments 113', 117', 161" and 171' may be aligned with Hext. The field Hext is thus greater than the coercivities of the structures 112, 116, 160 and 170. The field Hext is also greater than the coupling field between the layers 112 and 116. The applied field is also desired to be sufficiently large that the layer 112, 116, 160' or 170 having the smallest magnetic moment is saturated. In the embodiment shown, this layer may be the pinned layer 170.

FIG. 4B depicts the state of the magnetic junction 100' as the field Hext is reduced toward zero. Because the field has not reached zero, a field Hext2<Hext is shown as applied. The field Hext2 is less than the coupling field between the layers 112 and 116. Consequently, the magnetic moments 117" and 113" are antiparallel. The magnetic moments 117" and 113" are also canted out-of-plane because the perpendicular anisotropy energy of the layers 112 and 116 exceeds their out-of-plane demagnetization energy. Similarly, the magnetic moment 161" of the package structure 160' is also canted out of plane. Because of the ferromagnetic coupling between the package structure 160' and the reference layer 116', the magnetic moment 161''' is substantially aligned with the magnetic moment 117". The resulting flux lines from the package structure 160' are also shown. The orientation of the magnetic moment 161''' and the flux lines shown tend to cause the magnetic moment 171" to be canted in out-of-plane in the direction opposite to the magnetic moments 117" and 161".

The applied magnetic field continues to decrease to zero. Consequently, the moments of the magnetic layers 112, 116, 160' and 170 become oriented further out-of-plane due to their magnetic anisotropy. FIG. 4C depicts the magnetic junction 100' after the applied field has been reduced to zero and the magnetic junction 100' equilibrated. The magnetic junction 100' is thus in the dual state, with the magnetic moment 117 in the opposite direction to the magnetic moment 171. Thus, the magnetic junction 100' depicted in FIG. 4C is substantially the same as that depicted in FIG. 3A. However, lines of flux closure between the package structure 160' and the pinned layer 170 are also shown.

Thus, the magnetic junction 100' may be set to the dual state with the application of a single field in the hard axis direction (e.g. perpendicular to the easy axis). The setting procedure for the magnetic junction 100' is thus simplified. Spin transfer torque is enhanced when the magnetic junction 100' is in the dual state. Writing to the magnetic junction 100' using spin transfer torque may thus be more easily be improved. Consequently, performance of the magnetic junction 100' is further improved.

Figure 5:
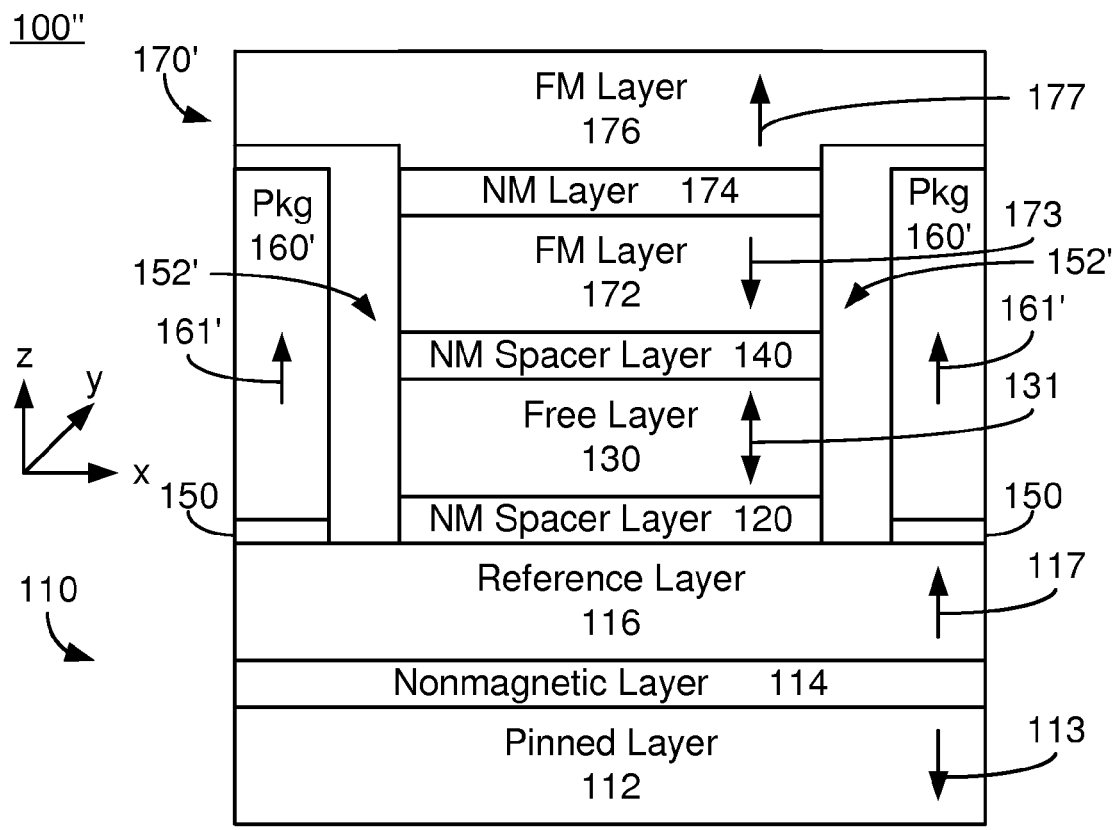
FIG. 5 depicts a side view of another exemplary embodiment of a magnetic junction usable in a magnetic device.

FIG. 5 depicts a side view of another exemplary embodiment of a magnetic junction 100". For clarity, FIG. 5 is not to scale and not all components of the magnetic junction are shown. For example, any seed and/or capping layers as well as the substrate are omitted. The magnetic junction 100" is analogous to the magnetic junctions 100 and 100'. Thus, analogous layers are labeled similarly. The magnetic junction 100' includes a pinned layer 110, a nonmagnetic spacer layer 120, a free layer 130, an optional additional nonmagnetic spacer layer 140, an optional interlayer 150, optional filler 152', an optional package structure 160' and a pinned layer 170' that are analogous to the pinned layer 110, nonmagnetic spacer layer 120, free layer 130, optional additional nonmagnetic spacer layer 140, optional interlayer 150, optional filler 152, optional package structure 160/160' and pinned layer 170, respectively. Thus, the magnetic junction 100" is a dual magnetic junction. As discussed above with respect to the magnetic junctions 100 and 100', other and/or additional layers might also be used. The magnetic junction 100" is also configured to allow the free layer 130 to be switched between stable magnetic states when a write current is passed through the magnetic junction 100". Thus, the free layer 130 is switchable utilizing spin transfer torque.

The magnetic junction 100" includes a wedding cake structure. Thus, the free layer 130 extends over only a portion of the top surface of the pinned layer 110. In the embodiment shown, the free layer 130 is also substantially centered on the pinned layer 110. In other embodiments, the free layer 130 may not be centered on the pinned layer 110 and/or may extend to one or more edges of the pinned layer. Although depicted as a simple layer, the free layer 130 may include multiple layers, as discussed above. The free layer 130 may have a perpendicular anisotropy energy that exceeds the out-of-plane demagnetization energy. Thus, the free layer 130 may have its magnetic moment 131 oriented perpendicular to plane. In other embodiments, other orientations of the magnetic moment of the free layer 130 are possible.

The spacer layers 120 and 140 are nonmagnetic. In some embodiments, the spacer layers 120 and/or 140 are insulators, for example a tunneling barrier. In such embodiments, the spacer layer(s) 120 and/or 140 may include crystalline MgO having a (100) orientation, which may enhance the TMR of the magnetic junction. Use of such material(s) may also enhance the perpendicular magnetic anisotropy of the free layer 130. In other embodiments, the spacer layer(s) 120 and/or 140 may be other material(s) including but not limited to conductor(s).

The pinned layer 110 shown is a SAF including ferromagnetic layers 112 and 116 separated by nonmagnetic layer 114. However, in other embodiments, the pinned layer 110 may be a simple layer. For example, the reference layer 116 may be used as the pinned layer 110 and the layers 112 and 114 omitted. The reference layer 116 and pinned layer 112 each has a perpendicular anisotropy energy that exceeds the out-of-plane demagnetization energy. Thus, the reference layer 116 and pinned layer 112 each has its magnetic moment 117 and 113, respectively, oriented perpendicular to plane. In other embodiments, the magnetic moments of the layers 112 and 116 might have other orientations. As discussed above, the lateral dimensions of the pinned layer 110 are larger than those of the free layer 130.

The pinned layer 170' is a SAF including ferromagnetic layers 172 and 176 separated by a nonmagnetic layer 174. The magnetic moments 173 and 177 of the ferromagnetic layers 172 and 176 are antiferromagnetically coupled. In addition, the magnetic moments 173 and 177 are perpendicular to plane. Each of the ferromagnetic layers 172 and 176 thus has a perpendicular anisotropy energy that exceeds the out-of-plane demagnetization energy. In other embodiments, the magnetic moments 173 and 177 may be oriented in another direction.

In the embodiment shown, the lateral dimensions of the ferromagnetic layer 172 and nonmagnetic layer 174 are substantially the same as that of the free layer 130. However, part of the ferromagnetic layer 176 extends over the package structure 160'. Another part of the ferromagnetic layer 176 has been narrowed and may be encircled by the package structure 160'. The ferromagnetic layer 176 is depicted as having rectangular cut outs near its edge. However, the narrowing may be accomplished in another manner. For example, the layer 176 may be trapezoidal in shape, with the smaller side closest to the ferromagnetic layer 172. In another embodiment, all of the ferromagnetic layer 176 may extend over the package structure 160'. The pinned layer 170' is, however, still spaced apart from the package structure 160'. In other embodiments, other configurations are possible.

The package structure 160' resides on a portion of the pinned layer 110 not occupied by the remaining stack. The interlayer 150 may reside between the package structure 160' and the pinned layer 110. The filler 152' is between the package structure and the layers 120, 130, 140 and 170'. Thus, a portion of the filler 152' is between the ferromagnetic layer 176 and the package structure 160'. Further, as discussed above, the filler 152' may be considered part of the interlayer 150 in some embodiments. The package structure 160' is ferromagnetic and encircles at least the free layer 130. The package structure 160' may be magnetically decoupled from the free layer 130, but ferromagnetically coupled with the pinned layer 110. More specifically, the package structure 160' is ferromagnetically coupled with the reference layer 116. The package structure 160' past the top of the ferromagnetic layer 172, but is below the bottom of at least a portion of the ferromagnetic layer 176. As discussed above, the package structure 160' may have other heights. The outer perimeter of the package structure 160' is substantially aligned with and the same as the perimeter of the pinned layer 110'. However, the inner perimeter of the package structure 160' is greater than the perimeter of the free layer 130 and, in the embodiment shown, the perimeter of the ferromagnetic layer 172.

The magnetic junction 100" may have improved performance. Because of the difference in lateral dimensions of the pinned layers 110 and the free layer 130, because of the difference in lateral dimensions of the ferromagnetic layer 176 and the free layer 130 and because of the presence of the package structure 160', stability of the pinned layers 110 and 170 may be improved. Back hopping may thus be mitigated or prevented. Further, the larger lateral size of the pinned layer 110 may translate to reduced cell-to-cell variations when the magnetic junction 100" is used in a memory array. In addition, use of a SAF for the pinned layers 110 and 170 may result in a reduced net magnetostatic field on the free layer 130. Thus, performance of the magnetic junction 100" may be improved. In addition, the differences in the pinned layer 110 and 170' may more naturally result in different tunneling magnetoresistances across the spacer layers 120 and 140.

Thus, the magnetic junction 100' may be more easily read even when the pinned layers 110 and 170 are in the dual state as shown.

The magnetic junction 100" may also be more easily set in the dual state. The dual state may be set by applying a single field with or without an anneal. However, the single field applied may be desired to be at a small angle from the hard axis. In other words, the applied field may be at an angle from in plane. In some embodiments, this angle is greater than ten, but smaller than forty degrees. The larger lateral sizes of the pinned layer 110 and ferromagnetic layer 176 correspond to a larger moment than the ferromagnetic layer 172 and a greater tendency to align with an applied field. For example, the pinned layer 112, reference layer 116, ferromagnetic layer 172 and ferromagnetic layer 176 may align with the applied field when the applied field is sufficiently large. As the field is reduced, the reference layer 116 and ferromagnetic layer 176 remain generally aligned with the field. The interaction between the layers of the pinned layers 110 and 170' result in the smaller ferromagnetic layer 172 aligning antiparallel to the magnetic moments 117 and 177. As the field continues to be reduced, the perpendicular magnetic anisotropies of the layers 112, 116, 172 and 176 allow the magnetic moments 113, 117, 173 and 177 to be out of plane. Because of the interactions with the larger layers 112, 116 and 176, the magnetic moment 173 is antiparallel to the magnetic moment 177. Because they are antiferromagnetically coupled, the magnetic moments 113 and 117 are also antiparallel. Thus, the magnetic junction 100" may be more easily set in a dual state. In other embodiments, the size of the magnetic moments of the larger layers 112, 116, and 176 and the interactions between the layers 112, 116, 172 and 176 may be used to set the dual state using a high temperature anneal (e.g. to above the Curie temperatures) alone. Such a setting procedure functions in an analogous manner to that described above. However, the use of an applied magnetic field, particularly in connection with an anneal, is generally desired. Thus, writing to the magnetic junction 100" using spin transfer torque may more easily be improved.

Figure 6:
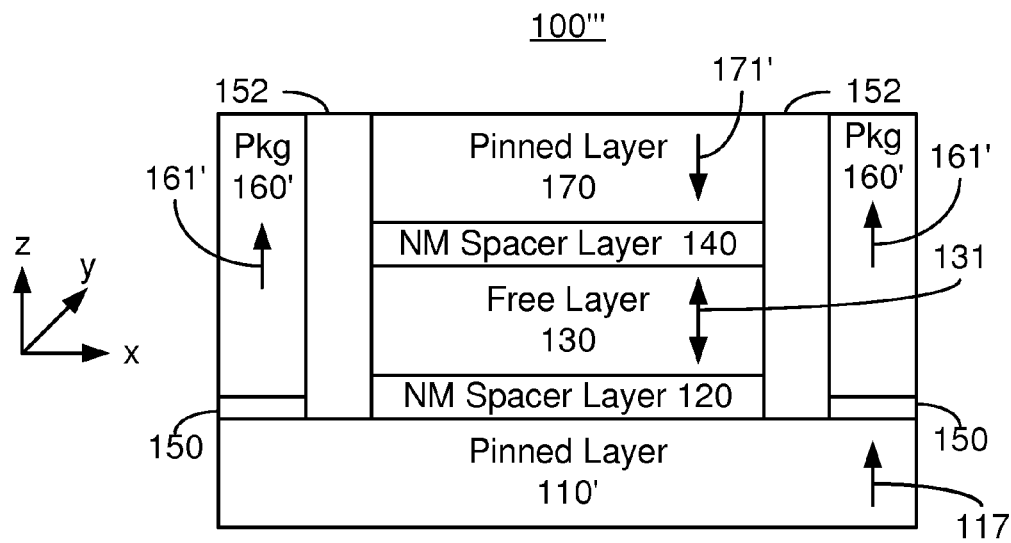
FIG. 6 depicts a side view of another exemplary embodiment of a magnetic junction usable in a magnetic device.

FIG. 6 depicts a side view of another exemplary embodiment of a magnetic junction 100'". For clarity, FIG. 6 is not to scale and not all components of the magnetic junction are shown. For example, any seed and/or capping layers as well as the substrate are omitted. The magnetic junction 100'" is analogous to the magnetic junctions 100, 100' and 100". Thus, analogous layers are labeled similarly. The magnetic junction 100'" includes a pinned layer 110', a nonmagnetic spacer layer 120, a free layer 130, an optional additional nonmagnetic spacer layer 140, an optional interlayer 150, an optional filler 152, an optional package structure 160' and a pinned layer 170 that are analogous to the pinned layer 110, nonmagnetic spacer layer 120, free layer 130, optional additional nonmagnetic spacer layer 140, optional interlayer 150, optional filler 152/152', optional package structure 160 and pinned layer 170, respectively. Thus, the magnetic junction 100'" is a dual magnetic junction. As discussed above with respect to the magnetic junctions 100, 100' and 100", other and/or additional layers might also be used. The magnetic junction 100'" is also configured to allow the free layer 130 to be switched between stable magnetic states when a write current is passed through the magnetic junction 100'". Thus, the free layer 130 is switchable utilizing spin transfer torque.

In the magnetic junction 100'", the pinned layer 110' is a simple pinned layer. Thus, only a single magnetic layer having a magnetic moment 117 is used. Although the pinned layer 170 is depicted, in another embodiment, the pinned layer 170' may be present instead. However, the structure and function of the layers remains substantially the same.

The magnetic junction 100'" may have improved performance. Because of the difference in lateral dimensions of the pinned layer 110' and the free layer 130 and the presence of the package structure 160' stability of the pinned layers 110 and 170 may be improved. Back hopping may thus be mitigated or prevented. Further, the larger lateral size of the pinned layer 110 may translate to reduced cell-to-cell variations when the magnetic junction 100" is used in a memory array. In addition, the differences in the pinned layer 110' and 170 may more naturally result in different tunneling magnetoresistances across the spacer layers 120 and 140. Thus, the magnetic junction 100'" may be more easily read even when the pinned layers 110 and 170 are in the dual state as shown. Further, the magnetic junction 100'" may be more easily set in the dual state because of the presence of the package structure 160'. Thus, writing to the magnetic junction 100'" using spin transfer torque may more easily be improved.

Figure 7:
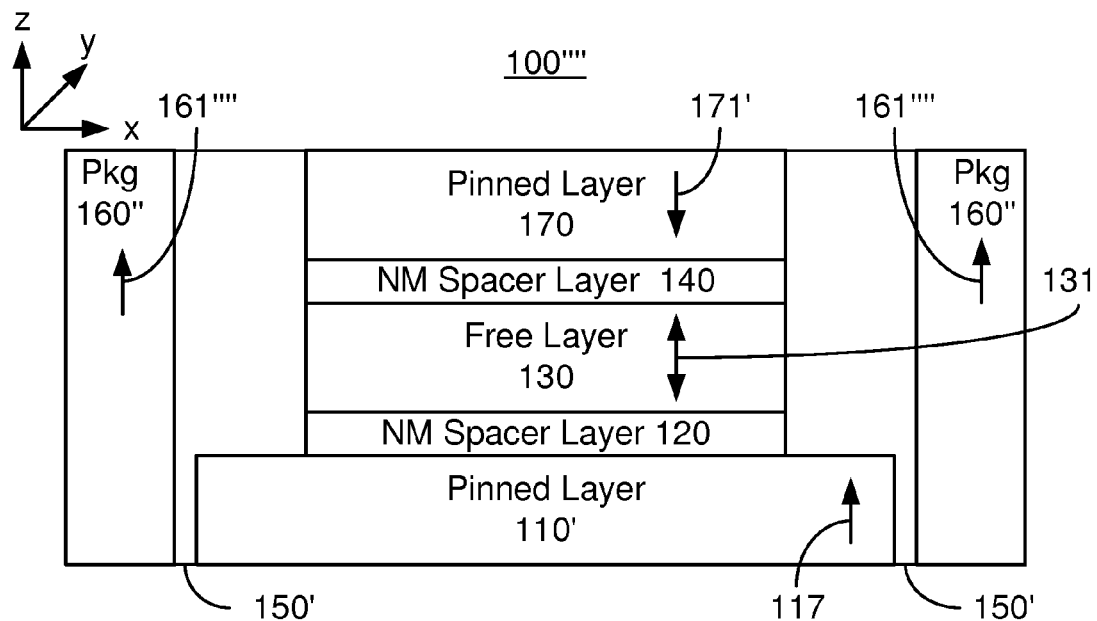
FIG. 7 depicts a side view of another exemplary embodiment of a magnetic junction usable in a magnetic device.

FIG. 7 depicts a side view of another exemplary embodiment of a magnetic junction 100"". For clarity, FIG. 7 is not to scale and not all components of the magnetic junction are shown. For example, any seed and/or capping layers as well as the substrate are omitted. The magnetic junction 100"" is analogous to the magnetic junctions 100, 100', 100" and 100'". Thus, analogous layers are labeled similarly. The magnetic junction 100"" includes a pinned layer 110', a nonmagnetic spacer layer 120, a free layer 130, an optional additional nonmagnetic spacer layer 140, an optional interlayer 150', an optional package structure 160" and a pinned layer 170 that are analogous to the pinned layer 110, nonmagnetic spacer layer 120, free layer 130, optional additional nonmagnetic spacer layer 140, optional interlayer 150/optional filler 152/152', optional package structure 160 and pinned layer 170, respectively. Thus, the magnetic junction 100"" is a dual magnetic junction. As discussed above with respect to the magnetic junctions 100, 100', 100" and 100'", other and/or additional layers might also be used. The magnetic junction 100"" is also configured to allow the free layer 130 to be switched between stable magnetic states when a write current is passed through the magnetic junction 100"". Thus, the free layer 130 is switchable utilizing spin transfer torque.

In the magnetic junction 100'", the pinned layers 110' and 170 are each a simple pinned layer. However, in other embodiments, one or both of the layers 110' and 170 may be a multilayer including but not limited to a SAF. However, the structure and function of the layers remains substantially the same.

In addition, the package structure 160" encircles both the pinned layer 110' and the free layer 130'. Thus, the outer perimeters of the layers 110', 120, 130, 140 and 170 are smaller than the inner diameter of the package structure 160". The package structure 160" is, however, still ferromagnetically coupled to the pinned layer 110'. In addition, the package structure 160" is still desired to be sufficiently high that it extends at least to the top of the free layer 130. In the embodiment shown, the package structure 160" extends to the top of the pinned layer 170. In other embodiments, other heights may be possible. Also in the embodiment shown, the interlayer 150' between the pinned layer 110' and the package structure 160" is explicitly considered to include the filler between the package structure 160" and the layers 120, 130, 140 and 170. In some embodiments, the interlayer 150' may include multiple layers and/or multiple materials.

The magnetic junction 100"" may have improved performance. Because of the difference in lateral dimensions of the pinned layer 110' and the free layer 130 and the presence of the package structure 160" stability of the pinned layers 110 and 170 may be improved. Back hopping may thus be mitigated or prevented. Further, the larger lateral size of the pinned layer 110 may translate to reduced cell-to-cell variations when the magnetic junction 100''' is used in a memory array. In addition, the differences in the pinned layer 110' and 170 may more naturally result in different tunneling magnetoresistances across the spacer layers 120 and 140. Thus, the magnetic junction 100'''' may be more easily read even when the pinned layers 110 and 170 are in the dual state as shown. Further, the magnetic junction 100'''' may be more easily set in the dual state because of the presence of the package structure 160". Thus, writing to the magnetic junction 100'''' using spin transfer torque may more easily be improved.

Figure 8:
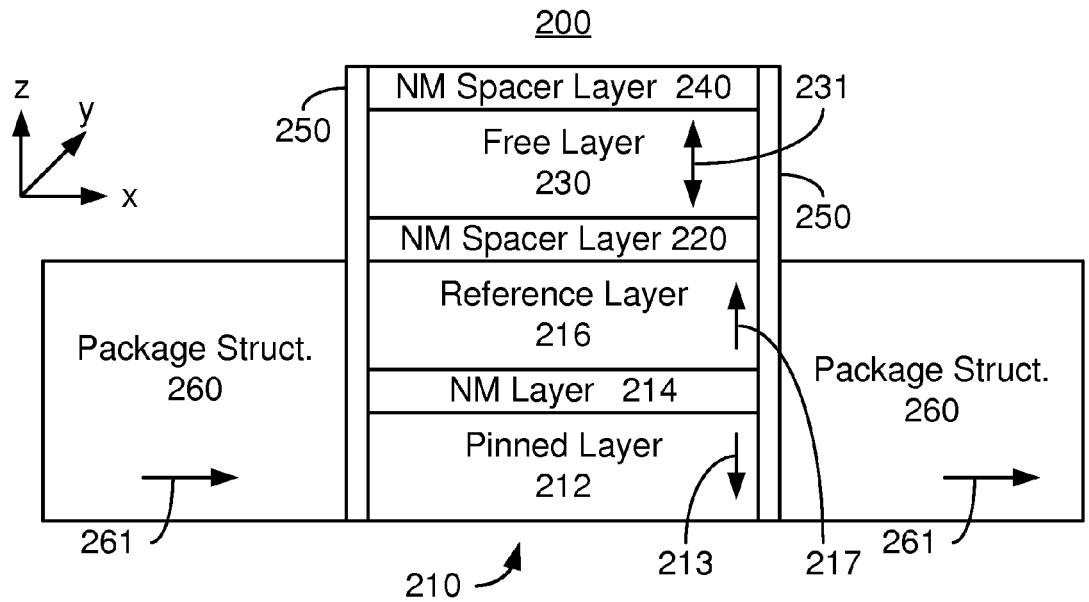
FIG. 8 depicts a side view of another exemplary embodiment of a magnetic junction usable in a magnetic device.

FIG. 8 depicts a side view of another exemplary embodiment of a magnetic junction 200. For clarity, FIG. 8 is not to scale and not all components of the magnetic junction are shown. For example, any seed and/or capping layers as well as the substrate are omitted. The magnetic junction 200 is analogous to the magnetic junctions 100, 100', 100", 100''' and/or 100''''. Thus, analogous layers are labeled similarly. The magnetic junction 200 includes a pinned layer 210, a nonmagnetic spacer layer 220, a free layer 230, an optional additional nonmagnetic spacer layer 240, an interlayer 250 and a package structure 260 that are analogous to the pinned layer 110/110', nonmagnetic spacer layer 120, free layer 130, optional additional nonmagnetic spacer layer 140, optional interlayer 150/150'/optional filler 152/152' and optional package structure 160/160'/160", respectively. Thus, analogous material(s) may be used. As discussed above with respect to the magnetic junctions 100, 100', 100", 100''' and/or 100'''', other and/or additional layers might also be used. The magnetic junction 200' is also configured to allow the free layer 230 to be switched between stable magnetic states when a write current is passed through the magnetic junction 200. Thus, the free layer 230 is switchable utilizing spin transfer torque.

The magnetic junction 200 includes a wedding cake structure in that the free layer 230 extends over only a portion of the width of the magnetic junction 200. In the embodiment shown, the free layer 230 extends substantially over and is substantially centered on the pinned layer 210. However, as discussed below, the package structure 260 encircles both the free layer 230 and the pinned layer 210. Stated differently, the inner perimeter of the package structure 260 is larger than the perimeter of the free layer 230 and the pinned layer 210. Thus, the magnetic junction 200 may be considered to have a wedding cake structure, albeit a modified one. Although depicted as a simple layer, the free layer 230 may include multiple layers, as discussed above. The free layer 230 may have a perpendicular anisotropy energy that exceeds the out-of-plane demagnetization energy. Thus, the free layer 230 may have its magnetic moment 231 oriented perpendicular to plane. In other embodiments, other orientations of the magnetic moment of the free layer 230 are possible.

The spacer layers 220 and 240 are nonmagnetic. In some embodiments, the spacer layers 220 and/or 240 are insulators, for example a tunneling barrier. In such embodiments, the spacer layer(s) 220 and/or 240 may include crystalline MgO having a (100) orientation, which may enhance the TMR of the magnetic junction. Use of such material(s) may also enhance the perpendicular magnetic anisotropy of the free layer 230. In other embodiments, the spacer layer(s) 220 and/or 240 may be other material(s) including but not limited to conductor(s). In some embodiments, the spacer layer 240 may be omitted.

The pinned layer 210 shown is a SAF including ferromagnetic layers 212 and 216 separated by nonmagnetic layer 214. However, in other embodiments, the pinned layer 210 may be a simple layer. For example, the reference layer 216 may be used as the pinned layer 210 and the layers 212 and 214 omitted. The reference layer 216 and pinned layer 212 each has a perpendicular anisotropy energy that exceeds the out-of-plane demagnetization energy. Thus, the reference layer 216 and pinned layer 212 each has its magnetic moment 217 and 213, respectively, oriented perpendicular to plane. In other embodiments, the magnetic moments of the layers 212 and 216 might have other orientations.

The package structure 260 encircles the pinned layer 210. The interlayer 250 may reside between the package structure 260 and the pinned layer 210. In some embodiments, the interlayer 250 is not more than five nanometers thick. Thus, the package structures 260 and pinned layer 210 may be separated by no more than three nanometers. In some embodiments, the interlayer is not more than half a nanometers thick. However, the interlayer 250 is desired to be present to control the magnetic coupling between the pinned layer 210 and the package structure 260. Further, the package structure 260 includes soft magnetic material(s) and has an in-plane easy axis. In the embodiment shown, the easy axis is in the direction of the magnetic moments 261. The package structure 260 may be magnetically decoupled from the free layer 230, but ferromagnetically coupled with the pinned layer 210. More specifically, the package structure 260 is exchange decoupled from the pinned layer 210. However, the package structure 260 may be magnetostatically or otherwise coupled with the pinned layer 210. In the embodiment shown, the package structure 260 extends to the top of the pinned layer 210. As discussed above, the package structure 260 may have other heights. The inner perimeter of the package structure 260 is greater than the perimeter of the pinned layer 210. Further, the pinned layer 210 is centered in the aperture in the package structure 260. Thus, the package structure 260 is spaced apart and magnetically decoupled from the free layer 230. In other embodiments other configurations, such as the pinned layer 210 being offset from the center of the package structure, may be used.

Figure 9:
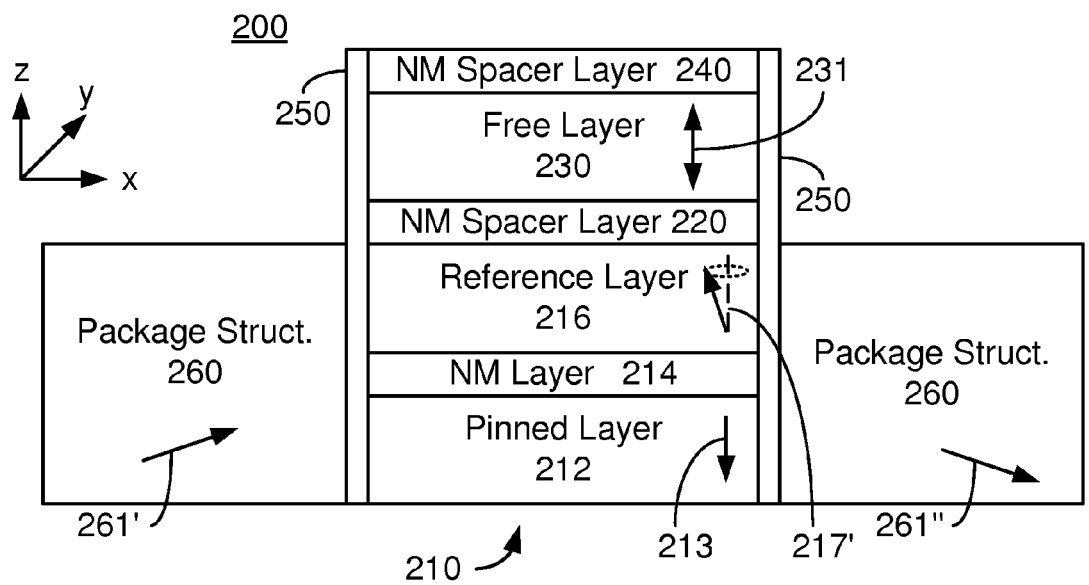
FIG. 9 depicts a side view of another exemplary embodiment of a magnetic junction usable in a magnetic device during writing.

The magnetic junction 200 may have improved performance. Because of the presence of the package structure 260 that is magnetically coupled to the pinned layer 210, stability of the pinned layer 210 may be improved. This may be seen with reference to FIG. 9, which depicts the magnetic junction 200 during writing. Application of the perpendicular-to-plane write current may perturb the magnetic moment of the reference layer 216. This is shown by the magnetic moment 217' of the reference layer 216 precessing around the easy axis in FIG. 9. The soft magnetic package structure 260 has its magnetic moment similarly perturbed. Thus, the magnetic moments 261' and 261" are precession around the easy axis of the package structure 260. However, the magnetic moments 261' and 261" tend to damp perturbations in the magnetic moment 217'. Thus, the magnetic junction 200 is more likely to return to the state depicted in FIG. 8. Consequently, the pinned layer 210 may be less likely to be disturbed during programming of the free layer 230 using a perpendicular-to-plane current. Back hopping may thus be mitigated or prevented. In addition, use of a SAF for the pinned layer 210 results in a reduced net magnetostatic field on the free layer 230. Thus, performance of the magnetic junction 200 may be improved.

Figure 10:
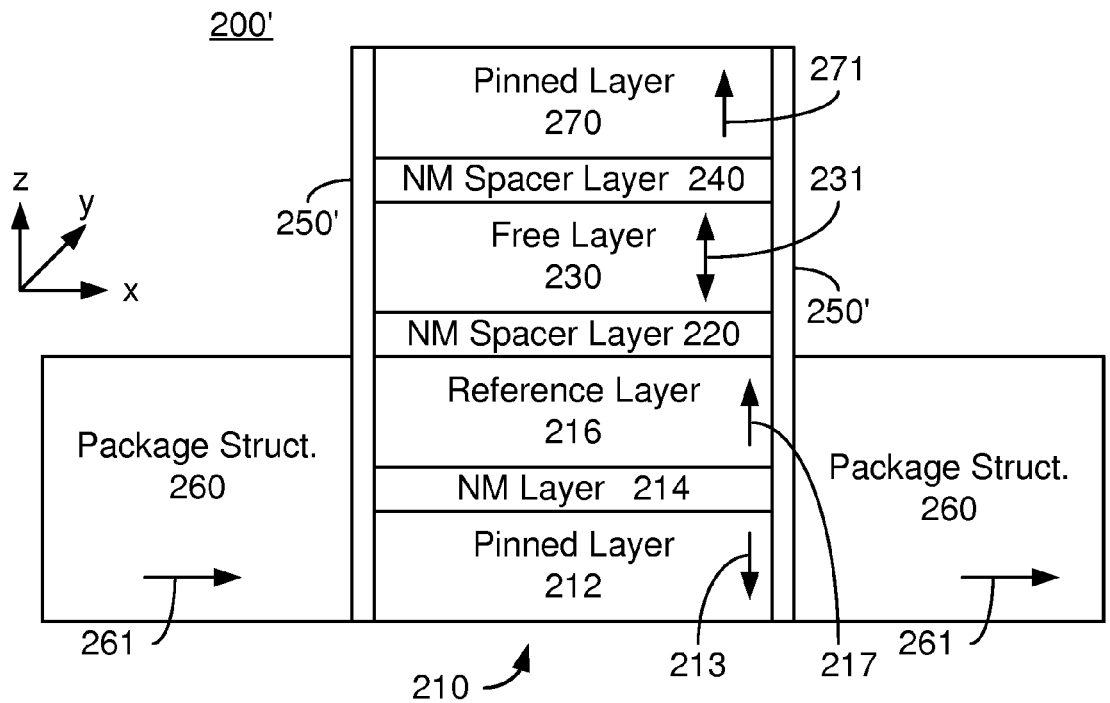
FIG. 10 depicts a side view of another exemplary embodiment of a magnetic junction usable in a magnetic device.

FIG. 10 depicts a side view of another exemplary embodiment of a magnetic junction 200'. For clarity, FIG. 10 is not to scale and not all components of the magnetic junction are shown. For example, any seed and/or capping layers as well as the substrate are omitted. The magnetic junction 200' is analogous to the magnetic junctions 200. Thus, analogous layers are labeled similarly. The magnetic junction 200' includes a pinned layer 210, a nonmagnetic spacer layer 220, a free layer 230, an optional additional nonmagnetic spacer layer 240, an interlayer 250' and a package structure 260 that are analogous to the pinned layer 210, nonmagnetic spacer layer 220, free layer 230, optional additional nonmagnetic spacer layer 240, interlayer 250 and package structure 260, respectively. In addition, the magnetic junction 200' includes a pinned layer 270. Thus, the magnetic junction 200' is a dual magnetic junction. As discussed above with respect to the magnetic junctions 200 other and/or additional layers might also be used. The magnetic junction 200' is also configured to allow the free layer 230 to be switched between stable magnetic states when a write current is passed through the magnetic junction 200'. Thus, the free layer 230 is switchable utilizing spin transfer torque.

In the magnetic junction 200', the pinned layer 270 is a simple pinned layer. Thus, only a single magnetic layer having a magnetic moment 271 is shown. In alternate embodiments, the pinned layer 270 may be a multilayer including but not limited to a SAF. The pinned layer 270 also has a perpendicular anisotropy energy that exceeds the out-of-plane demagnetization energy. Thus, the magnetic moment 271 is perpendicular to plane. In other embodiments, the pinned layer 270 may have its magnetic moment 271 oriented in another direction. In addition, the nonmagnetic interlayer 250' is extended to the pinned layer 270. However, in other embodiments, the nonmagnetic interlayer 270 may have another height. However, the structure and function of the layers remains substantially the same.

The magnetic junction 200' may have improved performance. Because of the presence of the package structure 260 stability of the pinned layers 210 and 270 may be improved. Back hopping may thus be mitigated or prevented. In addition, use of a SAF for the pinned layer 210 and/or 270 may result in a reduced net magnetostatic field on the free layer 230. Thus, performance of the magnetic junction 200' may be improved.

Figure 11:
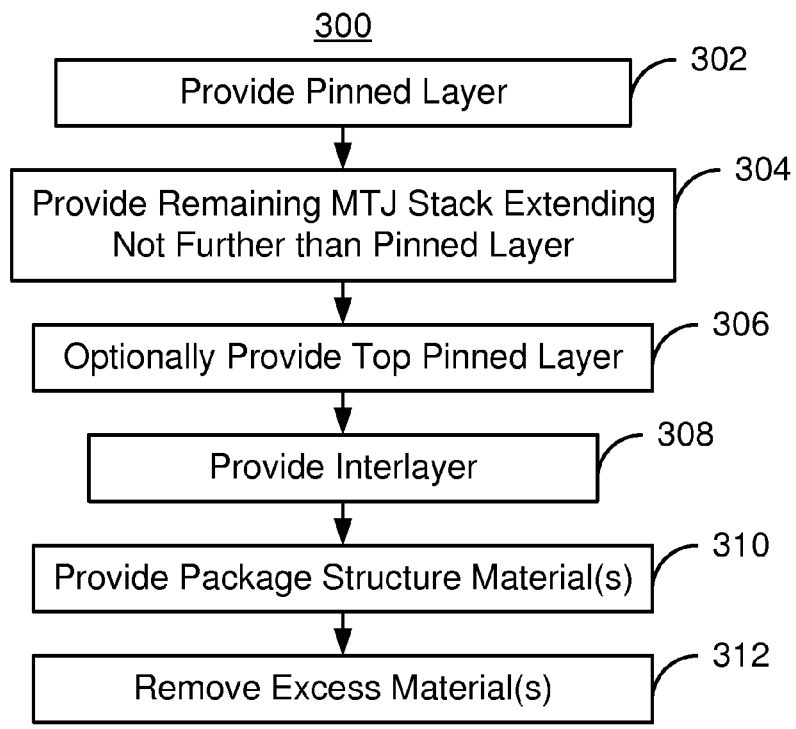
FIG. 11 depicts an exemplary embodiment of a method for providing an exemplary embodiment of a magnetic junction usable in a magnetic device.

FIG. 11 depicts an exemplary embodiment of a method 300 for fabricating magnetic junction. For simplicity, some steps may be omitted or combined. FIGS. 12-15 depict an exemplary embodiment of a magnetic junction 350 during fabrication using the method 300. For clarity, FIGS. 12-15 are not to scale and not all components are depicted. The method 300 is described in the context of the magnetic junction 350. However, the method 300 may be used on other magnetic substructure such as the junctions 100, 100', 100", 100''', 100'''', 200 and/or 200'. Further, the method 300 may be incorporated into fabrication of magnetic memories. Thus the method 300 may be used in manufacturing a STT-MRAM or other magnetic memory.

Figure 12:
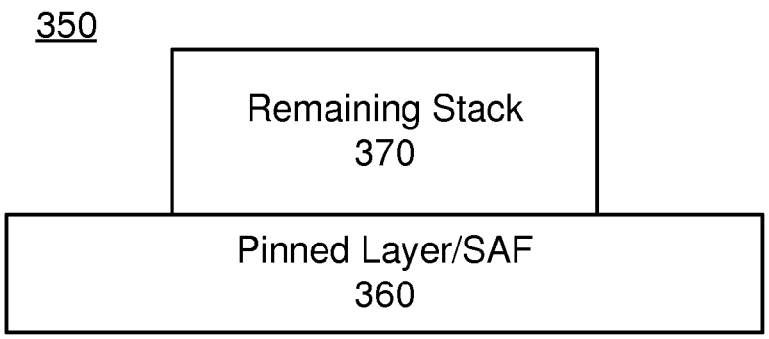
FIGS. 12-15 depict side views of an exemplary embodiment of a magnetic junction usable in a magnetic device during fabrication.

The pinned layer 360 is provided, via step 302. Step 302 may include depositing the desired materials at the desired thickness of the ferromagnetic layer 260. Multiple layers, for example for a SAF, may be provided as part of step 302. The remaining layers in the stack are provided, via step 304. These layers have lateral dimensions that are smaller than the pinned layer for the magnetic junctions 100, 100', 100", 100''' and/or 100''''. These layers have lateral dimensions that are approximately the same as the pinned layer for the magnetic junctions 200 and/or 200'. Step 304 may thus be performed by depositing the layers using ion beam deposition, sputtering, atomic layer deposition or another mechanism. A direction etch, reactive ion etch or ion mill may then remove the outer edges of the stack. The pinned layer 360 may also be defined. For example, FIG. 12 depicts the magnetic junction 350 after the stack 370 is provided. The perimeter of the stack 370 is less than that of the pinned layer 360. Thus, the embodiment shown may correspond to the magnetic junction 100, 100', 100", 100''' and/or 100''''. Alternatively, for the magnetic junction 200 and/or 200', these layers have the same lateral dimensions as the pinned layer. Thus, all of the layers for the stack 370 and pinned layer 360 may be milled through to provide stack having substantially the same lateral dimensions.

A top pinned layer, such as the layer 170, 170' and/or 270 may optionally be provided, via step 306. In some embodiments, step 306 occurs after the package structure has been fabricated. However, if the additional pinned layer has lateral dimensions that are less than the inner dimensions of the package structure, then step 306 may be performed before step 310.

Figure 13:
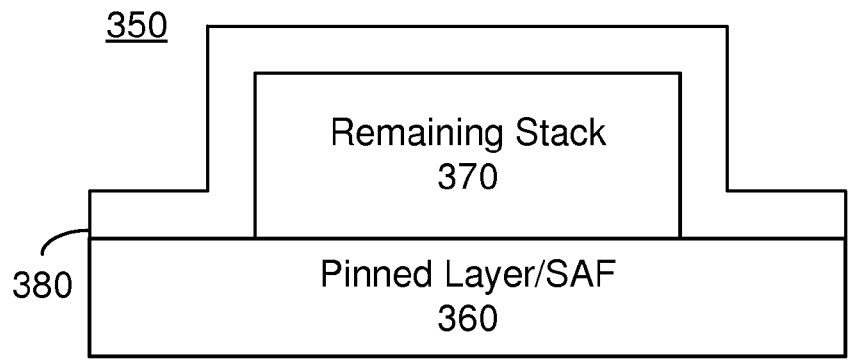

The interlayer may optionally be provided, via step 308. Step 308 may include depositing the desired nonmagnetic materials. For example, an insulating layer may be deposited via ion beam deposition, sputtering, or atomic layer deposition. In addition, the desired thickness of material may be deposited in step 308. FIG. 13 depicts the magnetic junction 350 after step 308 is performed. Thus, the interlayer 380 has been deposited.

Figure 14:
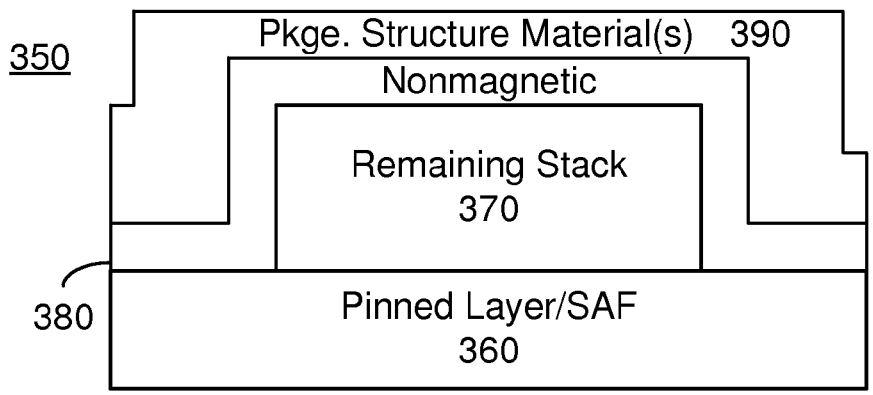

The material(s) for the package structure are deposited, via step 310. The magnetic materials for the package structure may be blanket deposited. For example, magnetic materials may be deposited via ion beam deposition, sputtering, or atomic layer deposition. FIG. 14 depicts the magnetic junction 350 after step 310 is performed. Thus, the materials 390 for the package structure have been deposited.

Figure 15:
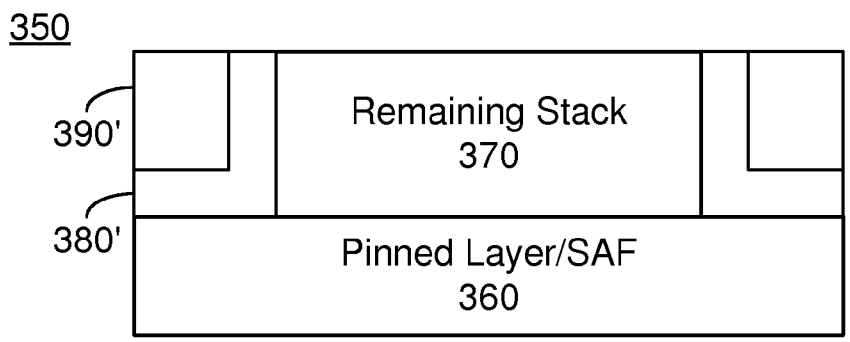

The excess materials may then be removed, for example via an ion mill or planarization, via step 312. FIG. 15 depicts the magnetic junction 250 after step 312 is performed. Thus, the package structure 390' and interlayer 380' remain. Thus, the magnetic junction 100, 100', 100", 100''', 100'''', 200 and/or 200' may formed. Consequently, the benefits of the magnetic junction 100, 100', 100", 100''', 100'''', 200 and/or 200' may be achieved.

Figure 16:
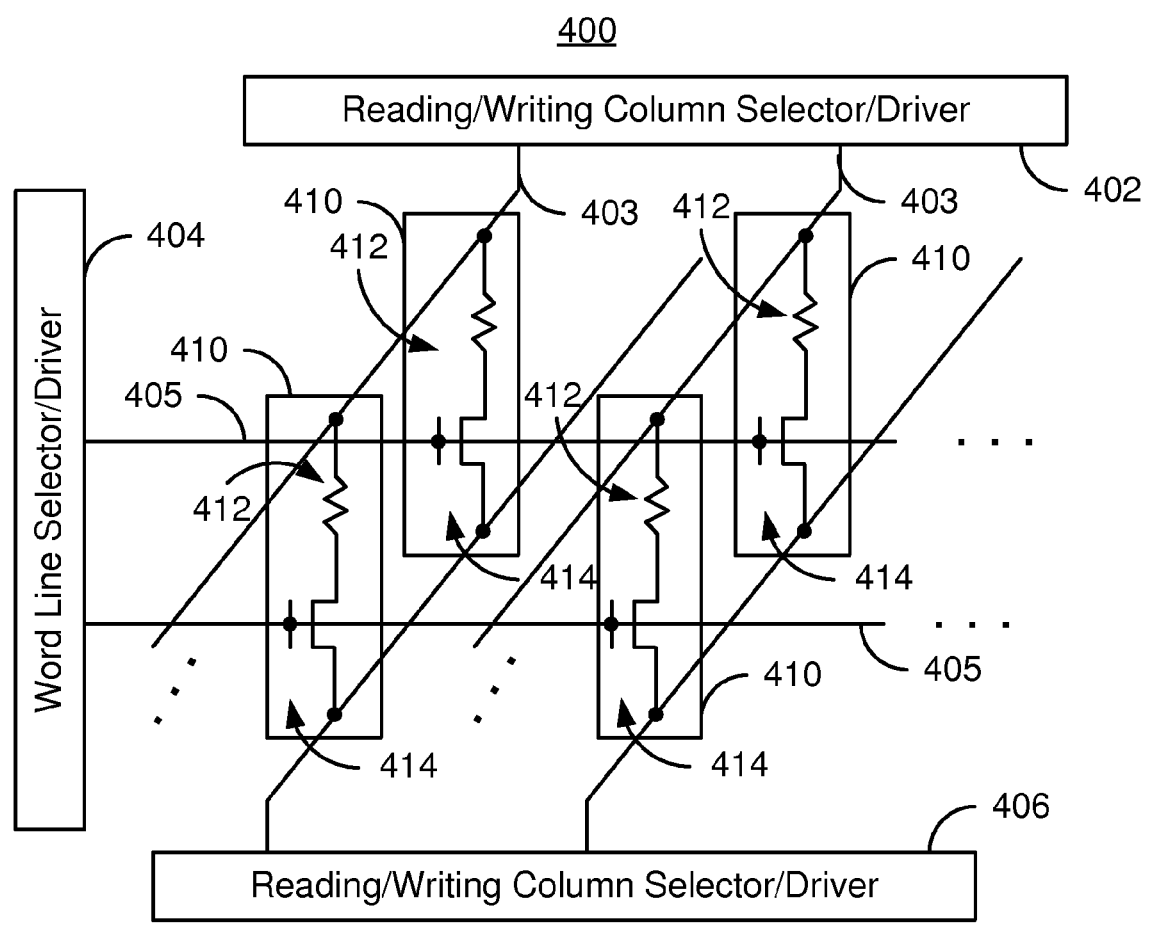
FIG. 16 depicts an exemplary embodiment of a memory utilizing magnetic junctions in the memory element(s) of the storage cell(s).

Further, the magnetic junctions 100, 100', 100", 100''', 100'''', 200 and/or 200' may be used in a magnetic memory. FIG. 16 depicts an exemplary embodiment of one such memory 400. The magnetic memory 400 includes reading/writing column select drivers 402 and 406 as well as word line select driver 404. Note that other and/or different components may be provided. The storage region of the memory 400 includes magnetic storage cells 410. Each magnetic storage cell includes at least one magnetic junction 412 and at least one selection device 414. In some embodiments, the selection device 414 is a transistor. The magnetic junctions 412 may be one of the magnetic junctions 100, 100', 100", 100''', 100'''', 200 and/or 200'. Although one magnetic junction 412 is shown per cell 410, in other embodiments, another number of magnetic junctions 412 may be provided per cell. As such, the magnetic memory 400 may enjoy the benefits described above, such as lower soft error rate and a low critical switching current.

Various magnetic junctions 100, 100', 100", 100''', 100'''', 200 and/or 200' have been disclosed. Note that various features of the magnetic junctions 100, 100', 100", 100''', 100'''', 200 and/or 200' may be combined. Thus, one or more of the benefits of the magnetic junctions 100, 100', 100", 100''', 100'''', 200 and/or 200' such as reduced write error rate and/or a more reliable setting mechanism for the pinned layers may be achieved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device comprising:
   a first pinned layer having a pinned layer perimeter and a top surface;
   a nonmagnetic spacer layer residing on at least a first portion of the top surface;
   a free layer, the nonmagnetic spacer layer residing between the pinned layer and the free layer, the free layer having a free layer perimeter, the free layer perimeter being not larger than the pinned layer perimeter; and
   at least one package structure, the at least one package structure being ferromagnetic and encircling at least one of the free layer and the pinned layer, the at least one package structure being ferromagnetically coupled with the first pinned layer;
   wherein the magnetic junction is configured such that the free layer is switchable between a plurality of stable magnetic states when a write current is passed through the magnetic junction.

2. The magnetic junction of claim 1 further comprising:
   an interlayer, at least a portion of the interlayer being between the package structure and the pinned layer.

3. The magnetic junction of claim 2 wherein the interlayer further includes a filler, at least a portion of the filler being between the package structure and the free layer.

4. The magnetic junction of claim 2 wherein the free layer perimeter is smaller than the pinned layer perimeter such that a second portion of the top surface of the pinned layer resides between the free layer perimeter and the pinned layer perimeter, wherein the at least one package structure substantially encircles the free layer and wherein at least a portion of the interlayer resides on the second portion of the top surface of the pinned layer.

5. The magnetic junction of claim 4 further comprising:
   an additional nonmagnetic spacer layer, the free layer being between the additional nonmagnetic spacer layer and the nonmagnetic spacer layer.

6. The magnetic junction of claim 5 further comprising:
   an additional pinned layer, the additional nonmagnetic spacer layer being between the free layer and the additional pinned layer.

7. The magnetic junction of claim 6 wherein the additional pinned layer further includes:
   a first ferromagnetic layer;
   a nonmagnetic layer; and
   a second ferromagnetic layer magnetically coupled with the first magnetic material, at least a portion of the at least one package structure residing directly between a portion of the pinned layer and a portion of the second ferromagnetic layer.

8. The magnetic junction of claim 7 wherein the portion of the package structure resides directly between the portion of the pinned layer and a portion of the first ferromagnetic layer.

9. The magnetic junction of claim 7 wherein the pinned layer includes:
   a ferromagnetic reference layer;
   a nonmagnetic layer;
   a ferromagnetic pinned layer magnetically coupled with the ferromagnetic reference layer, the nonmagnetic layer being between the ferromagnetic pinned layer and the ferromagnetic reference layer.

10. The magnetic junction of claim 2 wherein the pinned layer includes:
    a ferromagnetic reference layer;
    a nonmagnetic layer;
    a ferromagnetic pinned layer magnetically coupled with the ferromagnetic reference layer, the nonmagnetic layer being between the ferromagnetic pinned layer and the ferromagnetic reference layer.

11. The magnetic junction of claim 1 wherein the at least one of the free layer and the pinned layer has a perpendicular-to-plane magnetic moment.

12. The magnetic junction of claim 2 wherein the at least one package structure substantially encircles the pinned layer and wherein at least a portion of the interlayer resides between the pinned layer perimeter and the at least one package structure.

13. The magnetic junction of claim 1 wherein the nonmagnetic spacer layer includes crystalline MgO.

14. A magnetic memory comprising:
    a plurality of magnetic storage cells, each of the plurality of magnetic storage cells including at least one magnetic junction, the at least one magnetic junction including a first pinned layer, a nonmagnetic spacer layer, a free layer, and at least one package structure, the first pinned layer having a pinned layer perimeter and a top surface, the nonmagnetic spacer layer residing on at least a first portion of the top surface, the nonmagnetic spacer layer residing between the pinned layer and the free layer, the free layer having a free layer perimeter, the free layer perimeter being not larger than the pinned layer perimeter, the at least one package structure being ferromagnetic and encircling at least one of the free layer and the pinned layer, the at least one package structure being ferromagnetically coupled with the first pinned layer, the at least one magnetic junction being configured such that the free layer is switchable between a plurality of stable magnetic states when a write current is passed through the magnetic junction; and
    a plurality of bit lines.

15. The magnetic memory of claim 14 wherein the at least one magnetic junction further includes:
    an interlayer, at least a portion of the interlayer being between the package structure and the pinned layer.

16. The magnetic memory of claim 15 wherein the free layer perimeter is smaller than the pinned layer perimeter such that a second portion of the top surface of the pinned layer resides between the free layer perimeter and the pinned layer perimeter, wherein the at least one package structure substantially encircles the free layer and wherein at least a portion of the nonmagnetic interlayer resides on the second portion of the top surface of the pinned layer.

17. The magnetic memory of claim 16 wherein the at least one magnetic junction further includes:
    an additional nonmagnetic spacer layer, the free layer being between the additional nonmagnetic spacer layer and the nonmagnetic spacer layer.

18. The magnetic memory of claim 17 wherein the at least one magnetic junction further includes:
    an additional pinned layer, the additional nonmagnetic spacer layer being between the free layer and the additional nonmagnetic spacer layer.

19. The magnetic memory of claim 18 wherein a portion of the package structure resides directly between the portion of the pinned layer and a portion of additional pinned layer.

20. The magnetic memory of claim 15 wherein the at least one package structure substantially encircles the pinned layer and wherein at least a portion of the nonmagnetic interlayer resides between the pinned layer perimeter and the at least one package structure.

* * * * *